United States Patent
Pakbaz et al.

(10) Patent No.: US 6,794,676 B2
(45) Date of Patent: Sep. 21, 2004

(54) FABRICATION OF ORGANIC LIGHT EMITTING DIODE USING SELECTIVE PRINTING OF CONDUCTING POLYMER LAYERS

(75) Inventors: Hash Pakbaz, Oakland, CA (US); Karl Pichler, Santa Clara, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/374,219

(22) Filed: Feb. 25, 2003

(65) Prior Publication Data

US 2003/0129784 A1 Jul. 10, 2003

Related U.S. Application Data

(63) Continuation of application No. 09/955,867, filed on Sep. 19, 2001, now Pat. No. 6,569,706.

(51) Int. Cl.$^7$ .................. H01L 35/24; H01L 51/00; H01L 33/00; H01L 51/40
(52) U.S. Cl. ................ 257/40; 257/94; 438/99
(58) Field of Search .................. 257/40, 81, 96, 257/85, 94; 438/47, 99, 780

(56) References Cited

U.S. PATENT DOCUMENTS

| | | | | |
|---|---|---|---|---|
| 6,300,612 B1 | * | 10/2001 | Yu ........................ | 250/208.1 |
| 6,350,534 B1 | * | 2/2002 | Boerner et al. .......... | 428/690 |
| 6,372,154 B1 | * | 4/2002 | Li .......................... | 252/301.16 |
| 6,391,481 B1 | * | 5/2002 | Jonas et al. .............. | 428/690 |
| 6,441,395 B1 | * | 8/2002 | Yu et al. .................. | 257/40 |
| 2001/0001050 A1 | | 5/2001 | Miyashita et al. ........ | 428/690 |
| 2001/0052752 A1 | * | 12/2001 | Ghosh et al. ............. | 313/512 |

FOREIGN PATENT DOCUMENTS

| GB | WO 99/07189 | * | 2/1999 | .......... H05B/33/10 |
|---|---|---|---|---|
| WO | WO 01/39272 A1 | | 5/2001 | |

OTHER PUBLICATIONS

Applied Physics Letters, vol. 72, No. 21, article entitled "Polymer electroluminescent devices processed by inkjet . printing: I. Polymer light emitting logo" by Jayesh Bharathan and Yang Yang, published Mar. 25, 1998.*

Chang, et al., "Dual–Color Polymer Light–Emitting Pixels Processed by Hybrid Inkjet Printing", Applied Physics Letters, American Institute of Physics, vol. 73, No. 18, Nov. 2, 1998, pp. 2561–2563.

* cited by examiner

Primary Examiner—Jack Chen
Assistant Examiner—William Vesperman
(74) Attorney, Agent, or Firm—Thomas George

(57) ABSTRACT

A novel method for fabricating an OLED display is disclosed wherein the conducting polymer layer is selectively deposited over the surface of the display such that the conducting polymer is kept away from areas where its presence is either not required for the resulting structure or is difficult to remove with usual techniques, such as laser ablation. Other polymer layers may be deposited uniformly over the surface of the display by way of spin coating or other suitable methods known in the art.

7 Claims, 3 Drawing Sheets

FABRICATION OF ORGANIC LIGHT EMITTING DIODE USING SELECTIVE PRINTING OF CONDUCTING POLYMER LAYERS

CROSS-REFERENCE TO RELATED APPLICATIONS

This application is a continuation of Ser. No. 09/955,867, filed Sep. 19, 2001, of the same title now U.S. Pat. No. 6,569,706.

BACKGROUND OF THE INVENTION

The fabrication of organic light emitting diodes (OLEDs) is well known in the art. Typically, OLEDs are manufactured by depositing a plurality of electrically active polymer layers on top of a substrate with a first electrode—often ITO on top of glass. These various layers are processed in such a manner as to make a pattern of active pixel regions that are responsive to electrical signals addressing the pixels via column and row address lines in the case of a passive matrix display or alternatively via an active matrix thin-film-transistor (TFT) substrate with a common second electrode.

One of the major goals in manufacturing OLED displays is the reduction in manufacturing costs and the improvement of device reliability. Thus, the fewer processing steps or the least amount of time spent per step that are needed in their manufacture, the lower the cost. It is known in the manufacture of OLED displays that the step of patterning the polymer layers presents a particular set of problems. In many cases, the polymer layers are uniformly deposited over the whole substrate, for example, by spin-coating or evaporation techniques and the subsequent removal of the polymer layers over certain areas is required. It is known that some of these layers are very resistant to removal, for example, by ablation with a laser—making the resultant OLED display unreliable. Additionally, it is known that epoxy layers—that are often used to mechanically mate the OLED display with another piece of glass, metal or a foil to encapsulate the display—do not adhere well if residual thin, (e.g. incompletely ablated) layers of polymer exist, intervening between the glass and the epoxy.

Thus, it is desirable to deposit the polymer layers precisely on the display initially—rather than lay such polymer layers down over the entire display area and rely on removal techniques to effectively pattern the display.

SUMMARY OF THE INVENTION

The present invention discloses a novel method for fabricating an OLED display wherein one or more conducting polymer layers is/are selectively deposited over the surface of the display. These one or more conducting polymer layers are kept away from areas where its presence is either not required for the resulting structure or is difficult to remove with usual techniques, such as laser ablation. Other polymer layers may be deposited uniformly over the surface of the display by way of spin coating or other suitable methods known in the art.

In general, a method for fabricating an organic light emitting diode display is disclosed, the steps of said method comprising:

depositing first electrode layer onto a substrate;
selectively depositing a conducting polymer layer onto said substrate with the first electrode layer wherein said conducting polymer is selectively deposited on the surface of said display such that said conducting polymer layer is not deposited in areas wherein said conducting polymer is not present in the final display;
depositing a semiconducting electro-luminescent polymer layer over said conducting polymer layer,
depositing a second electrode; and
encapsulating the device.

DETAILED DESCRIPTION OF THE INVENTION

Figure 1:
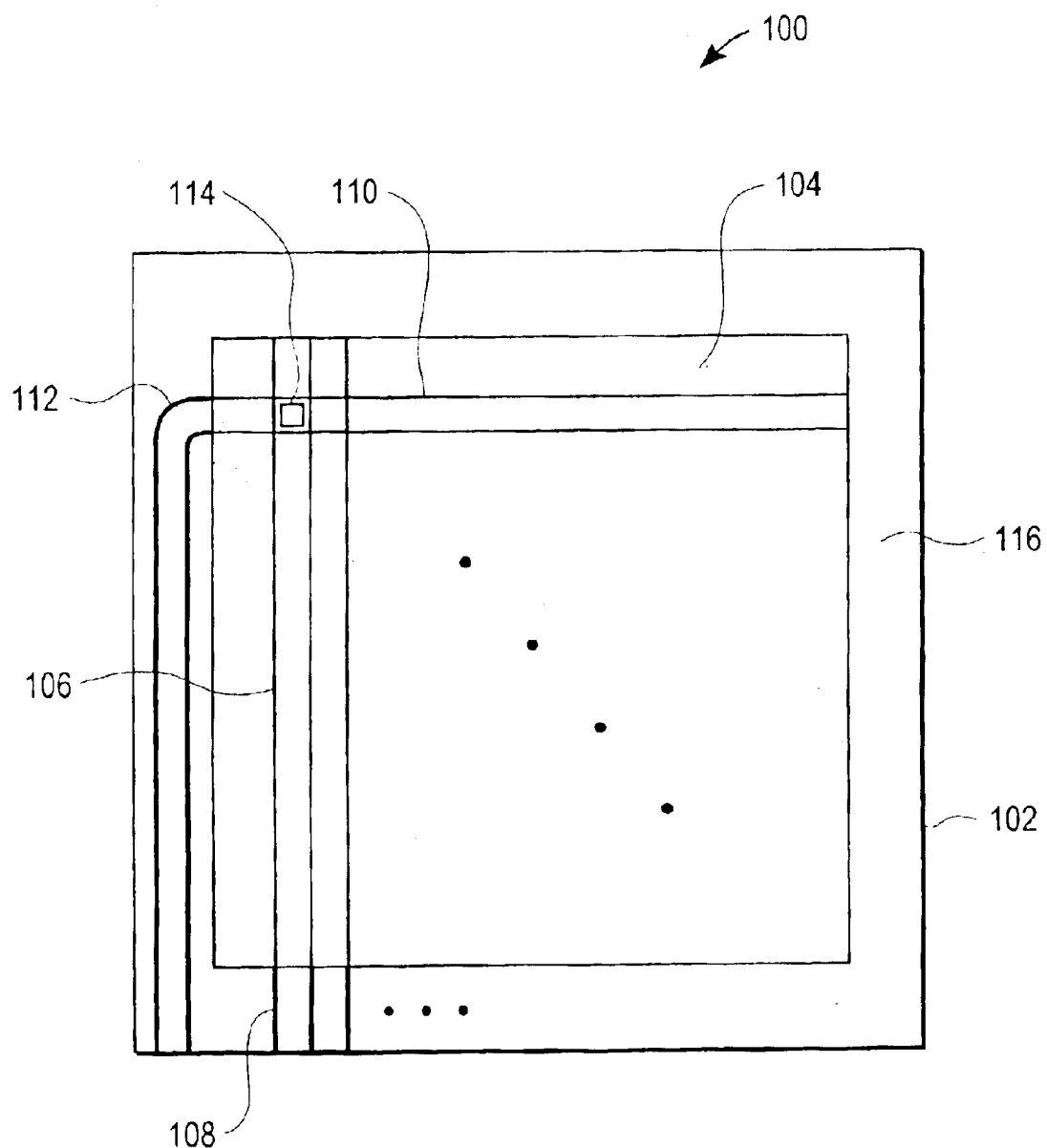
FIG. 1 is a top view of an OLED display after construction.

Referring now to FIG. 1, OLED display 100 is shown in top view. Display 100 comprises an ITO/glass substrate 102 upon which resides an active area 104 where light images may form depending upon electrical addressing to active pixel areas 114 via column addressing lines 106—typically comprising ITO—and row addressing lines 110. Metallization lines 108 and 112 are electrically mated to column and row addressing lines, respectively, to provide signaling on/off the display area. A border area (116) is provided so that epoxy may mechanically mate another layer of ITO/glass (not shown) to the initial ITO/glass substrate 102.

Figure 2:
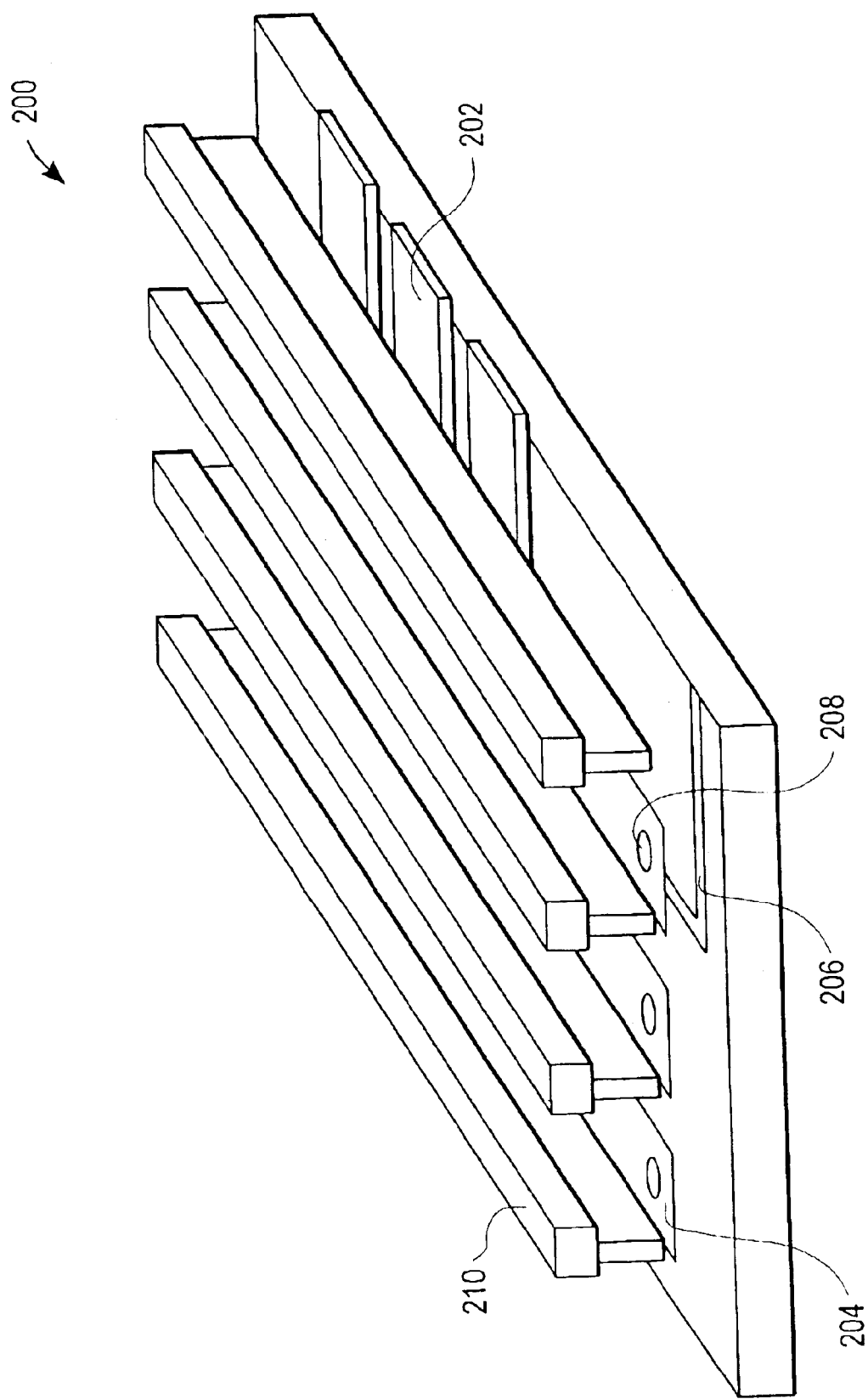
FIG. 2 is a side perspective view of an OLED display 200 midway in the manufacturing process.

FIG. 2 is a side perspective view of a passive matrix OLED display 200 midway in the manufacturing process. Display 200 comprises a set of ITO lines 202 (typically the columns) that are patterned on top of a glass substrate. After ITO patterning (usually via a photolithography and etching step), metallization lines (such as line 206) are deposited and patterned upon the ITO pattern in the usual fashions (e.g. metal deposition, photolithography and etch). Thereafter, "mushroom pillar" cathode separators 210 are formed upon the surface of the substrate. These pillars comprise photoresist layers that are patterned as shown via a photolithographic and etch step. One of the purposes of the pillars is to provide electrical separation of the individual rows of the top (or second) electrode layer. These pillars are typically thermally and directionally evaporated. For example, FIG. 2 depicts that metal cathode 204 are laid down—typically on top of various polymer layers—to provide electrical connection for the active pixel area (not shown) subsequently formed. To provide electrical connection to signals off the display, a via window is formed—usually by laser ablation through the various layers of polymers—to provide connection from the metal cathode layer 204 to metallization line 206.

Figure 3:
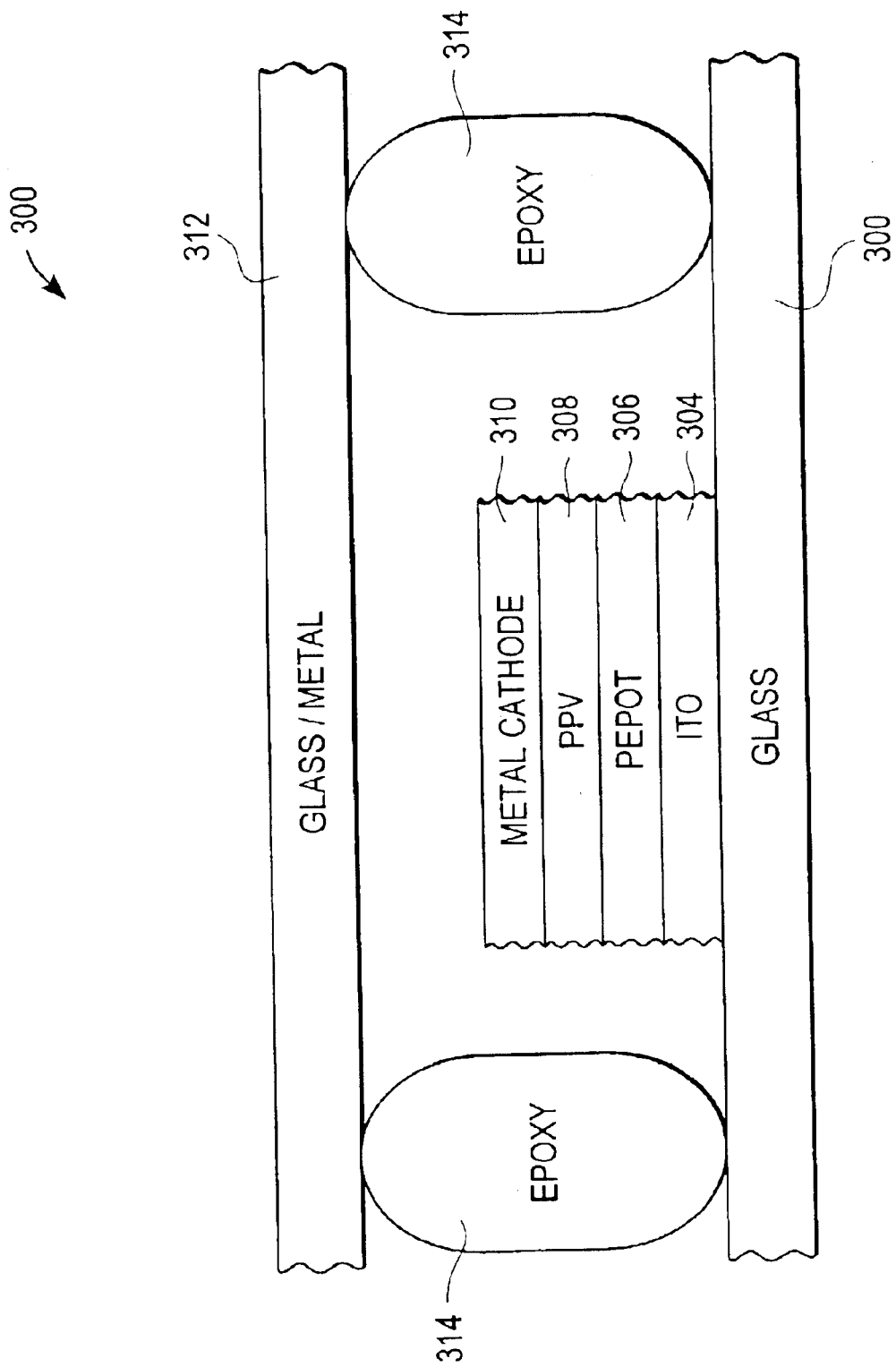
FIG. 3 is a cross-sectional view of the various layers comprising an OLED display.

FIG. 3 is a cross-sectional view of the various layers comprising an OLED display 300—without regard to the structure after further processing. It will be appreciated that the compositions of the various layers and their respective thicknesses are given for a single embodiment of an OLED display. The scope of the present invention, therefore, should not be limited to the particular embodiment disclosed herein.

Glass substrate 302 (in one embodiment, 0.7 nm in thickness) supports an ITO layer 304 (in one embodiment, of thickness of 100 nm). After patterning in the usual manners of the ITO, metalization and mushroom pillar layers, a conducting polymer layer 306 (typically Pedot or Pani) is deposited with thickness of typically but not necessarily between a few 10 to a few 100 nm. It will be appreciated that for the purposes of the present invention, the conductive polymer layer can be any such layer that is difficult to remove in subsequent processing steps. For example, it is known that Pedot and Pani have a poor absorption spectrum (e.g. low absorption coefficients) for typical laser ablation wavelengths. Additionally, there may be other conductive polymers that resist other types of removal processing steps that are suitable for the purposes of the present invention.

Additionally, for purposes of the present invention, the deposition of the conducting polymer layer is accomplished in a selective manner—e.g. screen printing, ink jet printing (continuous stream, drop-on demand, micro-contact printing, etc.), off-set printing, electrostatic printing, gravure printing, flexo-graphic printing, laser-induced thermal transfer printing or thermally-induced transfer printing, shadow stencil masking (for thermally evaporated small molecules) or other.

In the case of screen printing, it is desirable to lay and align a screen mesh across the top of the display—in the case of a passive matrix display for example on top of the mushroom pillars. It is known to construct the mesh such that—in areas where deposition is not desirable—there is mesh material to physically block the deposition of material. However the manner of selective deposition, practically speaking, the conducting polymer should be deposited in areas requiring active pixels and should not be deposited where the top electrode layer needs to electrically mate with the metalization lines pre-patterned on the substrate (e.g. where via holes are normally laser ablated), or along the outer edges where epoxy is to be deposited and adhering to glass, or on the contact pads that are used to connect the display to outside driver and supply electronics.

The conducting polymer 306 supports a semiconducting electro-luminescent polymer layer 308 (typically PPV) of typically but not necessarily between 50 and 100 nm thickness. Such electro-luminescent polymers are often PPV-based polymers, copolymers or blends, fluorine-based polymers, copolymers or blends or generally electro-luminescent polymers known in the prior art.

Alternatively, after deposition of the conducting polymer layer 306, the electro-luminescent layer could be a thermally evaporated small molecule organic or organo-metallic layer such as generally known in the prior art. The deposition of such evaporated small molecule layer could be over the whole display or be done patterned through a shadow mask.

Metal cathode layer 310 is deposited upon the semiconducting layer 308—in one embodiment, a few hundred nm thick, e.g. 200 nm. Finally, on top of these deposited and patterned layers sits another layer of glass, metal cap, metal sheet, foil 312 (or generally a piece largely impermeable to oxygen, water and other reactive gases and liquids). The layers/sheets are mechanically connected/adhered by epoxy 314 that is typically deposited along the outer edges of the display area. As was previously mentioned, if even a small layer of PEDOT polymer is laid down intervening the epoxy and the glass layers, the mechanical adhesion of the glass and epoxy and the environmental stability (e.g. at elevated temperature and/or humidity) of the display package may be severely compromised. Thus, it is desirable to remove the PEDOT completely from the outer edge before depositing the epoxy. In addition, the via holes in the polymer layer(s) that serve to connect the top electrode to the pre-patterned metallization lines on the substrate need to be free of polymer to ensure that the contact resistance between the top electrode and substrate metallization lines is minimized to avoid power loss and reduce display drive voltages. It might also be desirable not to have the Pedot/Pani and the like over the outside contact pads of the display.

It is known in the art to spin coat both the conducting and the semiconducting polymer layers to provide a nice planar layer of such polymers and then process the layers to provide the structure required. Of late, it has also become known to attempt to use alternative deposition technologies to apply the two polymer layers, such as ink jet or even screen printing both layers.

However, the present invention involves only the selective deposition, for example by screen printing, of only the conducting layer (typically PEDOT) as this polymer is difficult to ablate with a laser in order to pattern via holes or to remove for the purposes of mating epoxy and glass. The other layer—the semiconducting polymer—may be spun coat onto the display, as spin coating is a relatively inexpensive manufacturing step. As these other semiconducting electro-luminescent polymers are easier to laser ablate (or in the case of small molecules can be evaporated through masks but also laser ablated more easily), selective deposition of these layers is not as critical—thereby producing a cost savings in the manufacture of such devices.

It will be appreciated that the foregoing is merely one embodiment of fabricating an OLED display. There may other steps in a fabrication of an OLED structure not specifically disclosed herein. For example, there may be intervening layers between the ones herein disclosed or the disclosed layers may be deposited in another order. Other thicknesses and processing steps are possible for the construction of a useful OLED structure.

For another embodiment, the substrate could be constructed of various transparent glasses and plastics as well as opaque plastics, metallic foils or metallized plastic foils. Additionally, the present invention contemplates ITO (and generally other known transparent conductive metal oxides) as comprising either the bottom or the top electrodes. Additionally, it is possible to have either the top or the bottom electrode to serve as either the cathode or anode respectively. This would include such devices that are top-emitting (e.g. metal or ITO bottom electrode (anode) and top thin cathode together with a thicker transparent conductor (e.g. ITO and the like) which are both transparent.

Additionally, it will be appreciated that the order of deposition of the organic layers could be reversed. For example, the emitting layer could be deposited first, followed by the selectively deposited conducting polymer layer. In such an embodiment the display could be a top-emitting display in which the top electrode is a transparent anode deposited on top of the conducting polymer layer.

Additionally, the principles of the present invention relate with equal force and application to passive displays with rows and columns as well as active matrix displays, alpha-numeric or generally any segmented displays.

There has now been disclosed a manner of fabricating an OLED display using the techniques of selective deposition wherein the conducting polymer layer is selectively deposited that provides for its deposition in the area of an active pixel areas as well as blocking its introduction into areas where its presence is not required and/or its removal is difficult. It will be appreciated that the present invention contemplates all obvious extensions of the principles discussed herein and that the scope of the present invention should not be limited to the discussion of the particular embodiments herein disclosed.

What is claimed is:

1. An organic light emitting diode display, comprising:
   a substrate;
   a first electrode on said substrate;
   a plurality of metallization lines on said substrate;
   a plurality of organic layers on said first electrode;
   a second electrode on said plurality of organic layers;
   wherein said plurality of organic layers includes a conductive organic layer that is present in an area of an active pixel, and also includes a semiconductive organic layer that is present in said area of said active pixel and also outside said area, and
   wherein at least one of: (1) said first electrode is a patterned first electrode and (2) said second electrode is a patterned second electrode, and
   wherein said conductive organic layer is not on said plurality of metallization lines.

2. The organic light emitting diode display of claim 1 further comprising an epoxy layer that surrounds an active area of said display, wherein said conductive organic layer is not deposited on said epoxy layer.

3. The organic light emitting diode display of claim 1 wherein said conductive organic layer is on said semiconductive organic layer.

4. The organic light emitting diode display of claim 1 wherein said semiconductive organic layer is on said conductive organic layer.

5. The organic light emitting diode display of claim 1 wherein selectively depositing includes any one of the following techniques: screen printing, ink-jet printing, drop-on demand printing, micro-contact printing, off-set printing, electrostatic printing, gravure printing, flexographic printing, laser-inducted thermal transfer printing, thermally-induced transfer printing, or shadow stencil masking.

6. The organic light emitting diode display of claim 1 wherein at least one of: (1) said patterned first electrode is a plurality of first electrode strips, and (2) said patterned second electrode is a plurality of second electrode strips.

7. The organic light emitting diode display of claim 6 wherein said plurality of first electrode strips are a plurality of ITO strips, or said plurality of second electrode strips are a plurality of ITO strips.

* * * * *